(12) United States Patent
Ito et al.

(10) Patent No.: US 10,555,413 B2
(45) Date of Patent: Feb. 4, 2020

(54) INVERTER

(71) Applicant: KABUSHIKI KAISHA TOYOTA JIDOSHOKKI, Kariya-shi, Aichi-ken (JP)

(72) Inventors: Kenichiro Ito, Aichi-ken (JP); Naohito Kanie, Aichi-ken (JP); Kazuyoshi Kontani, Aichi-ken (JP); Takuya Higashi, Aichi-ken (JP)

(73) Assignee: KABUSHIKI KAISHA TOYOTA JIDOSHOKKI, Kariya-shi, Aichi-ken (JP)

( * ) Notice: Subject to any disclaimer, the term of this patent is extended or adjusted under 35 U.S.C. 154(b) by 0 days.

(21) Appl. No.: 16/256,309

(22) Filed: Jan. 24, 2019

(65) Prior Publication Data

US 2019/0246487 A1    Aug. 8, 2019

(30) Foreign Application Priority Data

Feb. 2, 2018    (JP) .................................. 2018-017445

(51) Int. Cl.
*H05K 1/02*    (2006.01)
*H02M 7/00*    (2006.01)
(Continued)

(52) U.S. Cl.
CPC .......... *H05K 1/0203* (2013.01); *H02M 7/003* (2013.01); *H05K 1/181* (2013.01);
(Continued)

(58) Field of Classification Search
CPC ....... H01L 2924/00; H01L 2924/00014; H01L 2224/97; H01L 2924/13091;
(Continued)

(56) References Cited

U.S. PATENT DOCUMENTS

| | | | | |
|---|---|---|---|---|
| 2014/0002054 A1* | 1/2014 | Higashikawa | ........... | G01R 1/04 324/76.11 |
| 2014/0285974 A1 | 9/2014 | Higashikawa et al. | | |
| 2015/0208500 A1* | 7/2015 | Kontani | .................... | H05K 1/11 361/782 |

FOREIGN PATENT DOCUMENTS

| | | |
|---|---|---|
| JP | 03173512 U | 1/2012 |
| JP | 2014-183719 A | 9/2014 |

(Continued)

*Primary Examiner* — Mandeep S Buttar
(74) *Attorney, Agent, or Firm* — Sughrue Mion, PLLC (57) ABSTRACT

An inverter includes a power substrate mounting power element groups arranged apart from each other, each power element group constituted by power elements arranged, a control substrate disposed apart from the power substrate in a plate thickness direction of the power substrate and mounting an electronic component for controlling the power elements, a capacitor substrate disposed between the power substrate and the control substrate and mounting capacitors, a release member fixed to the power substrate, and a spacer electrically connecting the power substrate and the capacitor substrate. The spacer includes a body portion disposed between two adjacent power element groups of the power element groups and a heat transfer portion disposed outside the power element groups in a direction in which the power elements are arranged and provided at a position not overlapping with the capacitors as viewed in a plate thickness direction of the capacitor substrate.

3 Claims, 6 Drawing Sheets

(51) Int. Cl.
*H05K 1/18* (2006.01)
*H05K 7/20* (2006.01)
(52) U.S. Cl.
CPC . *H05K 7/2089* (2013.01); *H05K 2201/10015* (2013.01); *H05K 2201/10409* (2013.01)
(58) Field of Classification Search
CPC . H01L 2924/13055; H01L 2224/16225; H01L 2224/45124; H01L 2224/49175; H01L 2224/32245; H01L 23/49822; H01L 24/97; H01L 2924/1306; H01L 2924/19041; H01L 2924/19105; H01L 23/36; H01L 23/50; H01L 25/0657; H01L 23/5385; H01L 23/642; H01L 2924/19104; H02M 7/003; H02M 7/53875; H05K 7/1432; H05K 1/181; H05K 2201/10166; H05K 1/0231; H05K 3/0061; H05K 7/209; H05K 1/142; H05K 1/144; H05K 2201/1053; H02K 11/33
USPC ........ 257/700; 361/704, 760, 803, 761, 688, 361/709, 735, 763, 783, 436, 679.54, 707; 165/104.33, 80.2, 80.3
See application file for complete search history.

(56) References Cited

FOREIGN PATENT DOCUMENTS

| | | | |
|---|---|---|---|
| JP | 2015-156784 | A | 8/2015 |
| JP | 2017-139934 | A | 8/2017 |

* cited by examiner

INVERTER

CROSS-REFERENCE TO RELATED APPLICATION

This application claims priority to Japanese Patent Application No. 2018-017445 filed on Feb. 2, 2018, the entire disclosure of which is incorporated herein by reference.

BACKGROUND ART

The present disclosure relates to an inverter.

Japanese Utility Model Registration No. 3173512 discloses an inverter that converts DC power into AC power and outputs the AC power. In the above Registration, the inverter includes a power substrate on which power elements are mounted, a capacitor substrate on which capacitors are mounted, a control substrate, and a heat release member that is fixed to the power substrate. The inverter includes spacers that are provided between the power substrate and the capacitor substrate. The spacers connect the power substrate and the capacitor substrate. The spacers also serve as a heat transfer path through which heat flows from the capacitor substrate to the power substrate. Thus, heat of the capacitor substrate flows through the power substrate to the heat release member.

When the insufficient cooling of capacitors occurs, the performance of the capacitors may deteriorate. The present disclosure is directed to providing an inverter for suppressing the insufficient cooling of capacitors.

SUMMARY

In accordance with an aspect of the present disclosure, there is provided an inverter including a power substrate mounting a plurality of power element groups arranged apart from each of the plurality of power element groups constituted by a plurality of power elements arranged, a control substrate disposed apart from the power substrate in a plate thickness direction of the power substrate and mounting an electronic component for controlling the plurality of power elements, a capacitor substrate disposed between the power substrate and the control substrate and mounting a plurality of capacitors, a heat release member fixed to the power substrate, and a spacer electrically connecting the power substrate and the capacitor substrate. The spacer includes a body portion disposed between two adjacent power element groups of the plurality of power element groups and a heat transfer portion disposed outside the plurality of power element groups in a direction in which the plurality of power elements are arranged and disposed at a position not overlapping with the plurality of capacitors as viewed in a plate thickness direction of the capacitor substrate.

Other aspects and advantages of the disclosure will become apparent from the following description, taken in conjunction with the accompanying drawings, illustrating by way of example the principles of the disclosure.

BRIEF DESCRIPTION OF THE DRAWINGS

The disclosure together with objects and advantages thereof, may best be understood by reference to the following description of the embodiments together with the accompanying drawings in which.

DETAILED DESCRIPTION OF THE EMBODIMENTS

The following will describe an inverter according to an embodiment of the present disclosure. The inverter according to the present embodiment is mounted on a battery type industrial vehicle such as a forklift truck. The inverter converts DC power input from a battery into AC power (three-phase AC) and outputs the AC power to a three-phase motor, so that the three-phase motor is driven.

Figure 1:
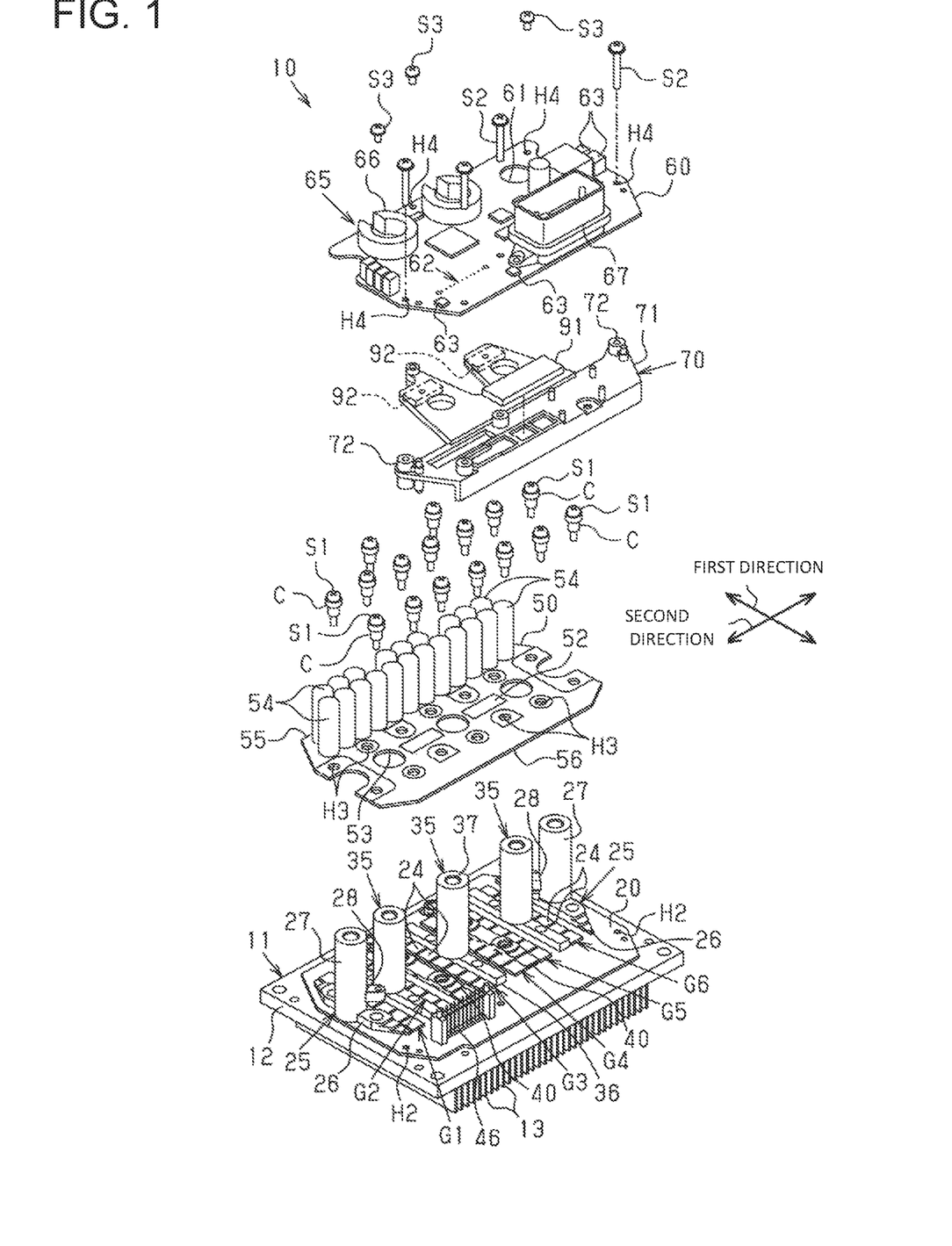
FIG. 1 is an exploded perspective view of an inverter according to an embodiment of the present disclosure.

Referring to FIG. 1, an inverter 10 includes a heat sink 11 as a heat release member. The heat sink 11 is made of a metal such as an aluminum-based metal or copper. The heat sink 11 includes a plate-like fixing member 12 and fins 13 protruding from one surface of the fixing member 12 in the plate thickness direction of the fixing member 12.

The inverter 10 includes a power substrate 20, a control substrate 60, and a capacitor substrate 50. The control substrate 60 is disposed apart from the power substrate 20 in the plate thickness direction of the power substrate 20. The capacitor substrate 50 is disposed between the power substrate 20 and the control substrate 60. The plate thickness directions of the power substrate 20, the control substrate 60, and the capacitor substrate 50 coincide with each other. The heat sink 11 and the three substrates 20, 50, and 60 are disposed in layers.

The inverter 10 includes a plurality of power elements 24, two input terminals 25, three output terminals 35, two spacers 40, and a pin-header 46. The power substrate 20 mounts the plurality of power elements 24, the input terminals 25, the output terminals 35, the spacers 40, and the pin-header 46. The power elements 24 in the present embodiment are a MOSFET. The power element 24 may be a switching element other than a MOSFET (for example, insulated gate bipolar transistor). The plurality of power elements 24 are disposed divided into six power element groups G1, G2, G3, G4, G5, and G6. That is, each of the power element groups G1, G2, G3, G4, G5, and G6 is constituted by the plurality of power elements 24. In the power element groups G1 to G6, the respective power elements 24 are arranged in a line. Hereinafter, the direction in which the power elements 24 constituting the power element groups G1 to G6 are arranged is referred to as a first direction.

The power element groups G1 to G6 are arranged apart from each other. Specifically, each of the power element groups G1 to G6 is arranged in a direction intersecting with the first direction among directions along the surface of the power substrate 20 in the plate thickness direction of the power substrate 20. Hereinafter, the arrangement direction of the power element groups G1 to G6 is referred to as a second direction. The power element groups G1 to G6 constitute upper and lower arms in the three-phase circuit of the inverter 10.

The power substrate 20 is fixed to the fixing member 12 on the opposite side to the surface of the fixing member 12 in the plate thickness direction of the fixing member 12, on which the fins 13 are provided. The power substrate 20 in the present embodiment is an insulating metal substrate (IMS), in which an insulating layer is provided on a metal base.

Figure 2:
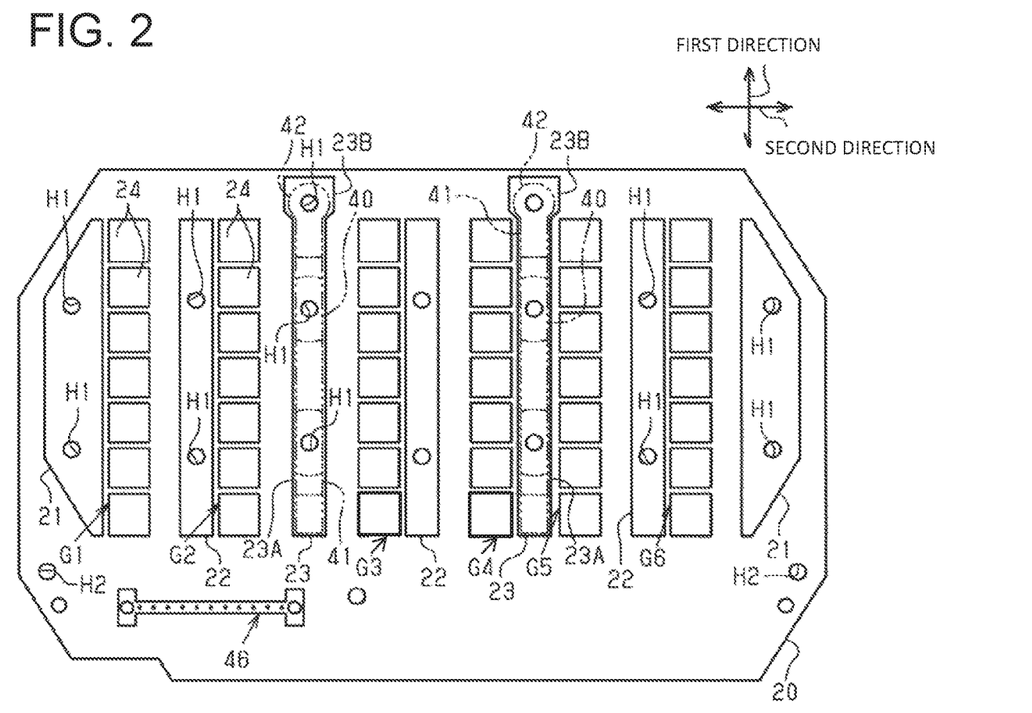
FIG. 2 is a plan view showing a power substrate of the inverter of FIG. 1.

Referring to FIG. 2, the power substrate 20 includes a plurality of conductor patterns 21, 22, and 23 to which the power elements 24 are electrically connected. The conductor patterns 21, 22, and 23 are arranged at an interval in the second direction. The conductor patterns 21, 22, and 23 include two conductor patterns 21 connected to the input terminals 25, three conductor patterns 22 connected to the output terminals 35, and two conductor patterns 23 connected to the spacers 40. The power elements 24 are connected to each of the conductor patterns 21, 22, and 23.

The conductor patterns 21 are disposed with the power element groups G1 to G6 sandwiched therebetween. The conductor patterns 22 are disposed between the two adjacent power element groups of the power element groups G1 to G6. The conductor patterns 23 are disposed between the power element groups G2 and G3 and between the power element groups G4 and G5. The conductor patterns 22 and the conductor patterns 23 are alternately disposed.

Each conductor patter 23 has a first portion 23A extending in the first direction between the power element groups G2 and G3 or between the power element groups G4 and G5 and a second portion 23B projecting in the first direction from the power element groups G2 and G3 or the power element groups G4 and G5. The second portion 23B is provided outside the power element groups G1 to G6 in the first direction.

The power substrate 20 includes a plurality of first insertion holes H1 and a plurality of second insertion holes H2 that penetrate in the plate thickness direction thereof. The first insertion holes H1 are provided in portions of the power substrate 20, where the conductor patterns 21, 22, and 23 are disposed. The two first insertion holes H1 are provided in each of the portions of the power substrate 20, where the conductor patterns 21 and 22 are disposed. The two first insertion holes H1 are provided in each of the portions of the power substrate 20, where the first portions 23A of the conductor patterns 23 are disposed. The one first insertion hole H1 is provided in each of the portions of the power substrate 20, where the second portions 23B of the conductor patterns 23 are disposed.

As shown in FIG. 1, the two input terminals 25 and the three output terminals 35 are arranged at intervals in the second direction. The two input terminals 25 are arranged with the power element groups G1 to G6 sandwiched therebetween. That is, the input terminals 25 are arranged closer to the outer edge of the power substrate 20 than the power element groups G1 to G6 in the second direction. The three output terminals 35 are arranged between the two input terminals 25. Each input terminal 25 includes a base portion 26, a columnar portion 27 protruding from the base portion 26, and a seat portion 28 protruding from the peripheral surface of the columnar portion 27. Each output terminal 35 includes a base portion 36 and a columnar portion 37 protruding from the base portion 36. The input terminal 25 and the output terminal 35 are made of a metal such as an aluminum-based metal or copper. A battery is connected to the input terminals 25. A three-phase motor is connected to the output terminals 35. The pin-header 46 is disposed closer to the outer edge of the power substrate 20 than the power element groups G1 to G6 in the first direction.

The two spacers 40 are arranged at an interval in the second direction. Each spacer 40 is disposed between the output terminals 35. The spacer 40 is made of a metal such as an aluminum-based metal or copper.

Figure 3:
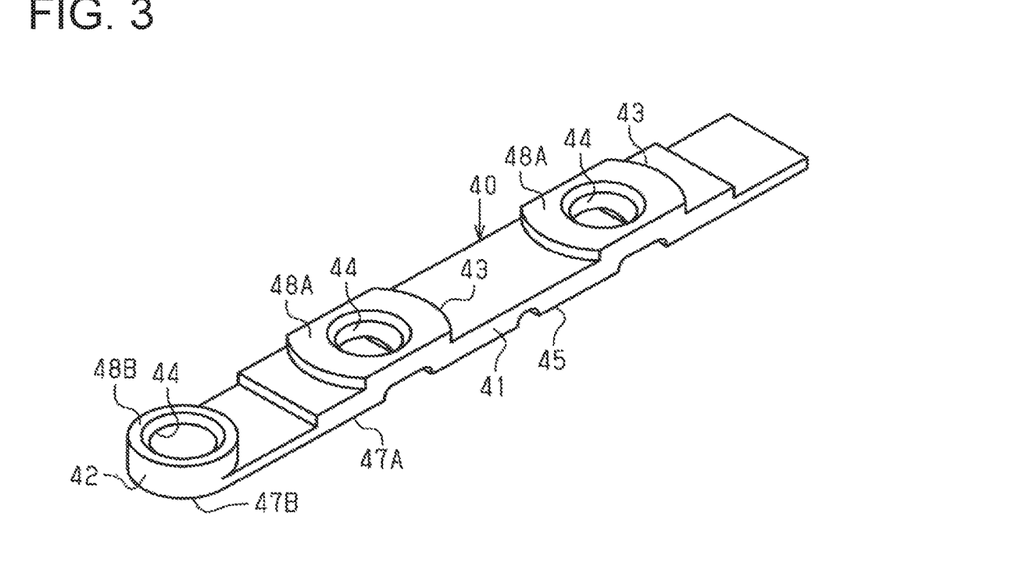
FIG. 3 is a perspective view showing a spacer of the inverter of FIG. 1.

Referring to FIG. 3, the spacer 40 includes a body portion 41 having a rectangular plate shape and a cylindrical heat transfer portion 42 provided at one end of the body portion 41 in the longitudinal direction of the body portion 41. The body portion 41 includes a base portion 45 and two contact portions 43 protruding from the base portion 45. The two contact portions 43 protrude in the plate thickness direction of the body portion 41. The two contact portions 43 and the heat transfer portion 42 are arranged side by side in the longitudinal direction of the body portion 41. The spacer 40 has therein two spacer holes 44 penetrating the spacer 40 in the plate thickness direction of the body portion 41. The spacer holes 44 of the body portion 41 are provided in the contact portions 43 and the heat transfer portion 42, respectively.

The spacer 40 includes first contact surfaces 47A and 47B that contact with the power substrate 20 and second contact surfaces 48A and 48B that contact with the capacitor substrate 50. Of opposite surfaces of the body portion 41 in the plate thickness direction of the body portion 41, the surface opposite to the surface of the body portion 41, on which the contact portion 43 is provided is the first contact surface 47A. Of opposite surfaces of the heat transfer portion 42 in the axial direction of the heat transfer portion 42, one surface is the first contact surface 47B. The distal end surface of each contact portion 43 is the second contact surface 48A. Of opposite surfaces of the heat transfer portion 42 in the axial direction of the heat transfer portion 42, the surface opposite to the first contact surface 47B is the second contact surface 48B. Each of the contact surfaces 47A, 47B, 48A, and 48B is smoothed by cutting.

As shown in FIG. 2, the body portion 41 of each spacer 40 overlaps with the first portion 23A of the conductor pattern 23. The heat transfer portion 42 of the spacer 40 overlaps with the second portion 23B of the conductor pattern 23. As a result, the first contact surfaces 47A and 47B of the spacer 40 are electrically connected to the power substrate 20 (the conductor pattern 23).

The body portions 41 of the spacers 40 are disposed between the two adjacent power element groups G2 and G3 of the power element groups G1 to G6 and between the two adjacent power element groups G4 and G5 of the power element groups G1 to G6. The heat transfer portions 42 of the spacers 40 are disposed outside the power element groups G1 to G6 in the first direction in which the power elements 24 are arranged.

Figure 4:
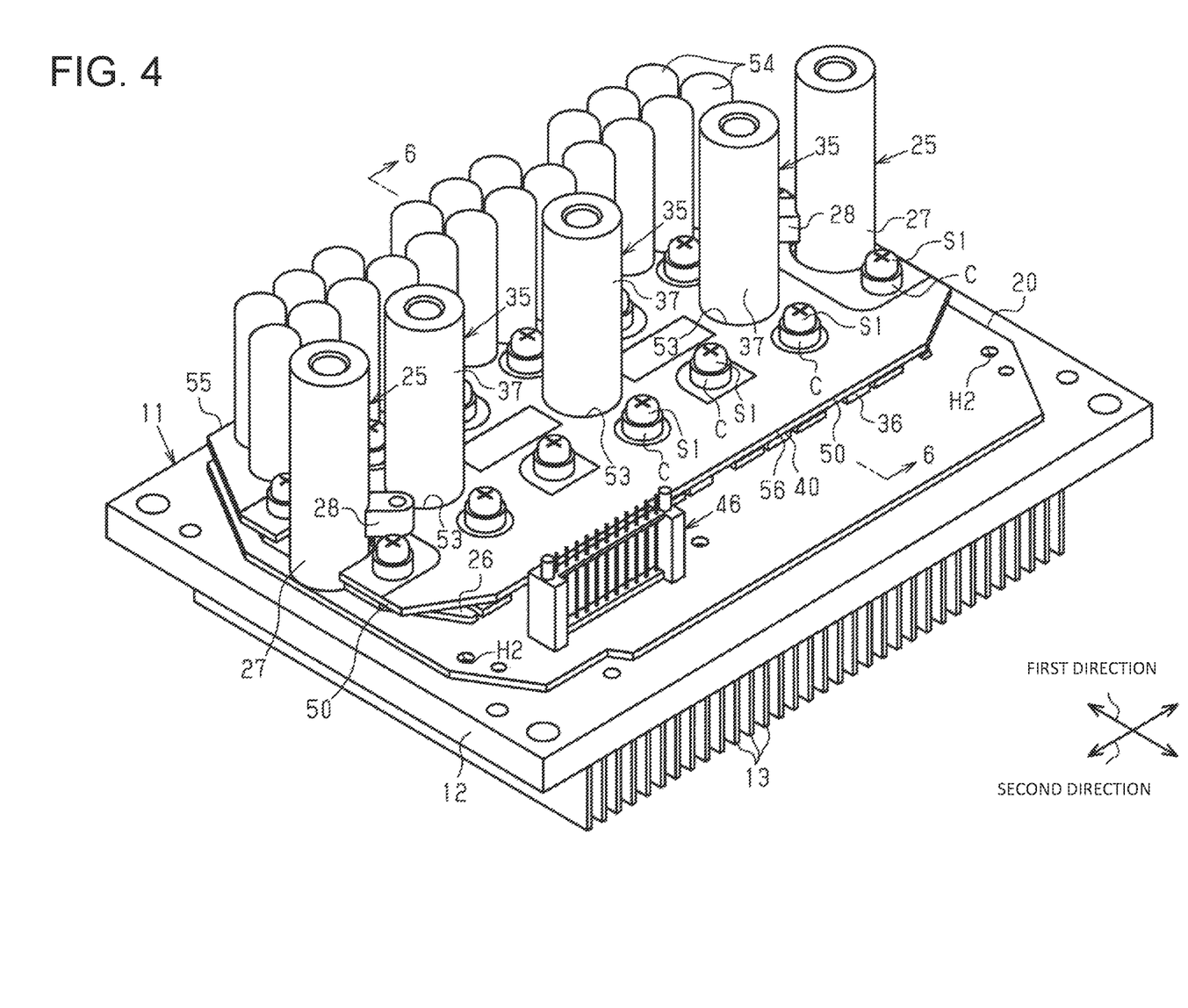
FIG. 4 is a perspective view showing the inverter of FIG. 1 in a state where a control substrate is omitted.
Figure 5:
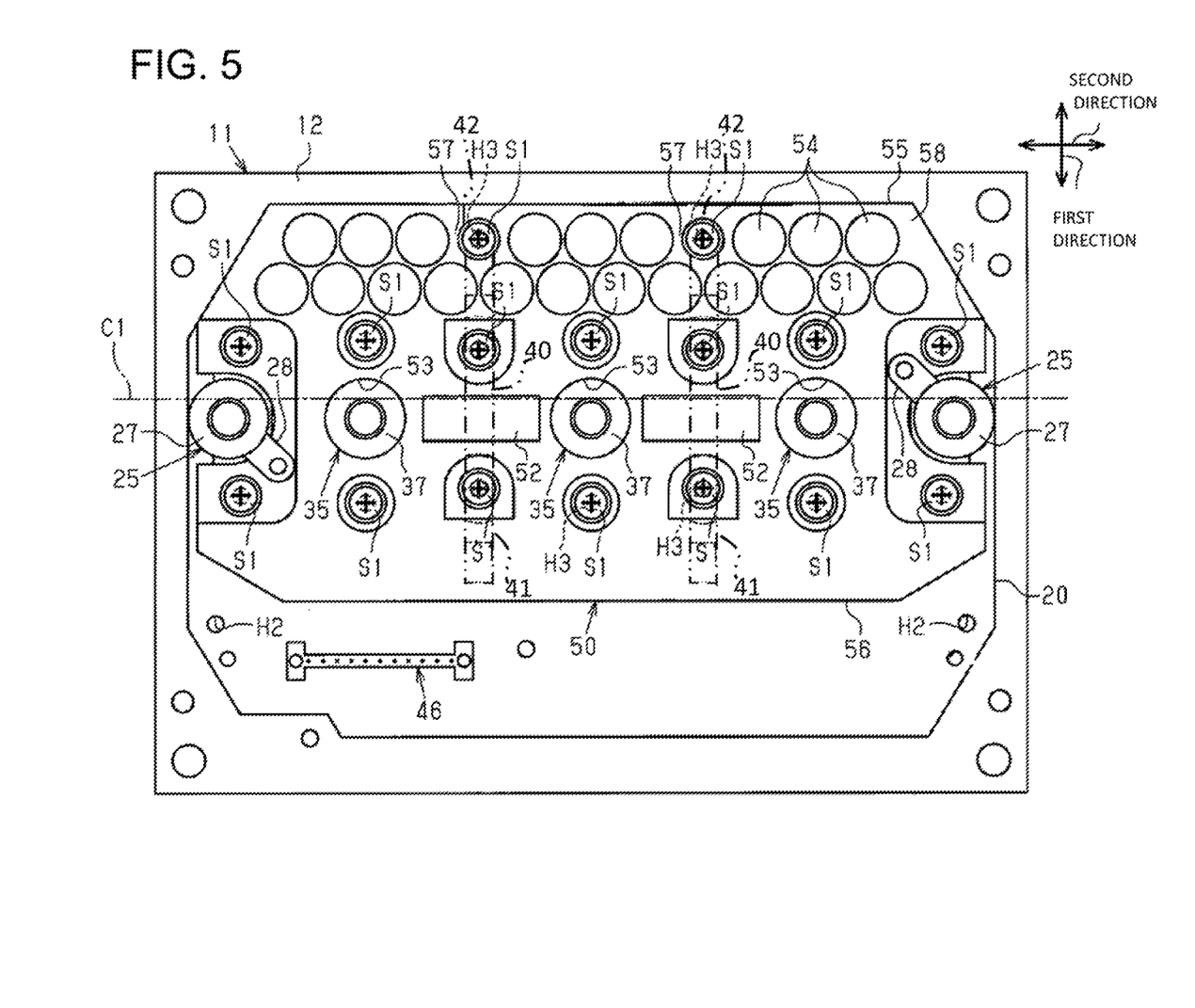
FIG. 5 is a plan view showing the inverter of FIG. 1 in a state where the control substrate is omitted.

Referring to FIGS. 4 and 5, the inverter 10 includes a plurality of capacitors 54 that the capacitor substrate 50 mounts. The plurality of capacitors 54 are arranged along an edge 55 of both edges 55, 56 of the capacitor substrate 50 in the first direction. The capacitors 54 are disposed collectively closer to a one end portion 58 than the center C1 of the capacitor substrate 50 in the first direction. The one end portion 58 is an end portion adjacent to the edge 55 of the capacitor substrate 50. When the capacitor substrate 50 is divided into two at the center C1 of the capacitor substrate 50 in the first direction, the capacitors 54 are arranged in one region and no capacitor 54 is arranged in the other region. The capacitor substrate 50 has non-arrangement regions 57 in which no capacitor 54 is provided in part of the portion along the edge 55. Each capacitor 54 has a columnar shape and is disposed so that the axial direction of the capacitor 54 coincides with the plate thickness direction of the capacitor substrate 50. That is, each capacitor 54 stands on the capacitor substrate 50.

As shown in FIGS. 1 and 5, the capacitor substrate 50 includes conductor patterns 52. The capacitor substrate 50 has therein output holes 53. The columnar portions 37 of output terminals 35 are inserted through the output holes 53, respectively. The capacitor substrate 50 has therein third insertion holes H3 penetrating in the plate thickness direction thereof. The third insertion holes H3 are provided at a plurality of positions including the non-arrangement regions 57. The third insertion holes H3 are provided in the same number as the first insertion holes H1. The interval between the third insertion holes H3 is the same as the interval between the first insertion holes H1. The third insertion holes H3 and the first insertion holes H1 are disposed to face each other, respectively, in the plate thickness direction of the capacitor substrate 50.

Figure 6:
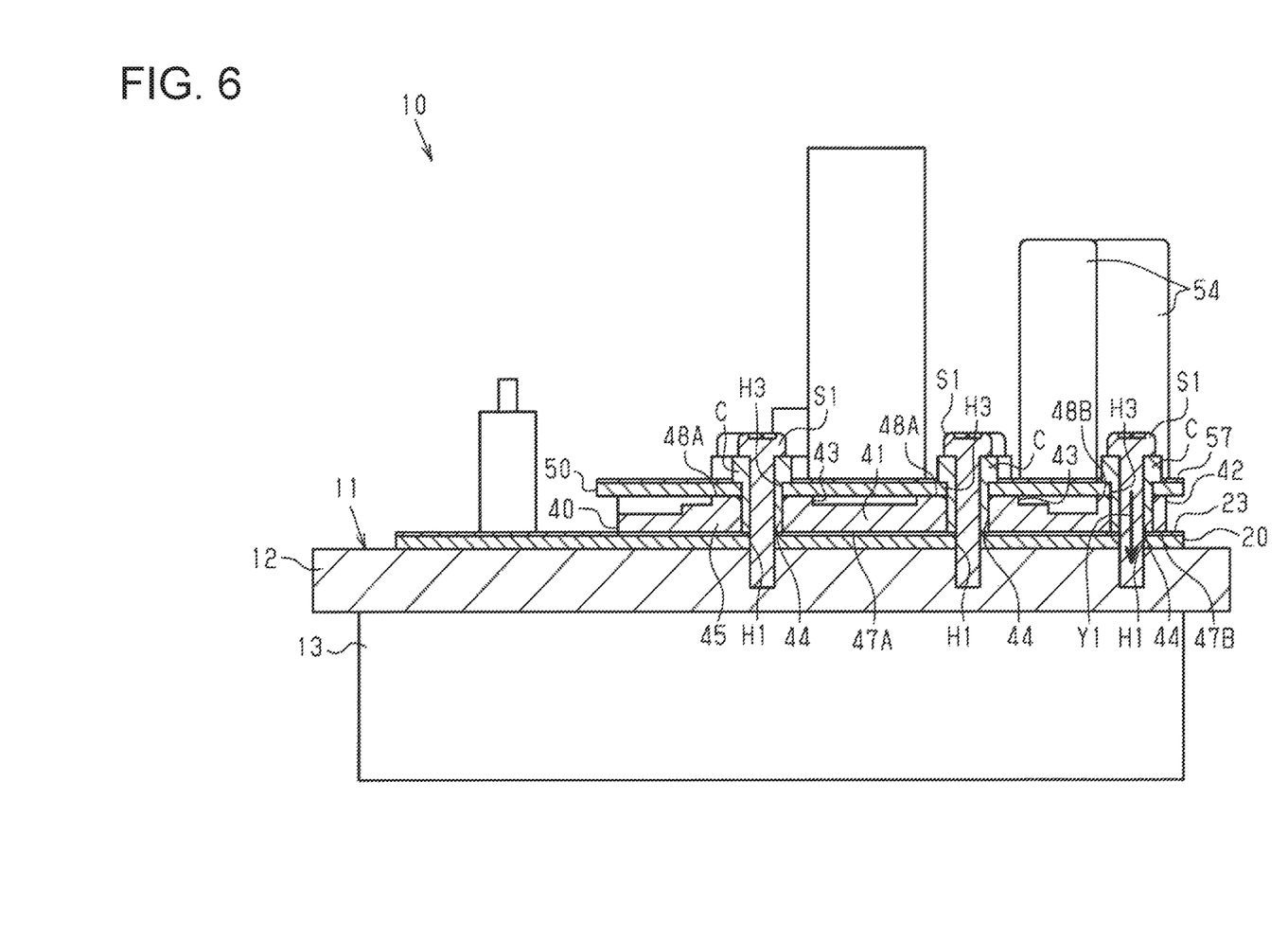
FIG. 6 is a cross-sectional view taken along line 6-6 of FIG. 4 showing the inverter of FIG. 1.

As shown in FIGS. 4 to 6, the capacitor substrate 50 is disposed so as to overlap with the base portions 26 of the input terminals 25, the base portions 36 of the output terminals 35, and the spacers 40. The capacitor substrate 50 is disposed so that the non-arrangement regions 57 and the heat transfer portions 42 of the spacers 40 face each other. The heat transfer portions 42 are disposed at positions not overlapping with the capacitor 54 as viewed in the plate thickness direction of the capacitor substrate 50. The second contact surfaces 48A and 48B of the spacers 40 are in contact with the capacitor substrate 50. The base portions 26 of the input terminals 25 and the spacers 40 electrically connect the capacitor substrate 50 and the power substrate 20.

As shown in FIG. 1, the control substrate 60 has therein three output holes 61 penetrating in the plate thickness direction of the control substrate 60. The columnar portions 37 of the output terminals 35 are inserted through the output holes 61, respectively. The control substrate 60 has therein a through hole 62 through which the pin-header 46 is inserted. The control substrate 60 has a plurality of fourth insertion holes H4 penetrating in the plate thickness direction of the control substrate 60.

The inverter 10 includes a plurality of electronic components 63, electric current sensors 65, and a connecting portion 67 that the control substrate 60 mounts. The electronic components 63 constitute a control circuit controlling the plurality of power elements 24 of each of the power element groups G1 to G6. The control circuit controls the power element groups G1 to G6 to convert power.

When the pin-header 46 is inserted into the through hole 62, the control substrate 60 and the power substrate 20 are electrically connected. The two electric current sensors 65 are provided at two of the three output terminals 35. Each electric current sensor 65 includes a core 66 and a hall element (not shown in the drawing). The connecting portion 67 is a female connector connecting a control apparatus (upper level control apparatus) controlling the inverter 10, to the inverter 10.

The inverter 10 includes a bracket 70 that is provided to fix the control substrate 60 to the heat sink 11. The bracket 70 includes a plate-shaped body portion 71 and a plurality of fastening bosses 72 that protrude in the plate thickness direction of the body portion 71. The fastening bosses 72 maintain the distance between the power substrate 20 and the control substrate 60. The bracket 70 is made of a metal such as an aluminum-based metal or copper.

The inverter 10 includes a heat transfer member 91 disposed between the bracket 70 and the control substrate 60 and interposed heat transfer members 92 disposed between the bracket 70 and the capacitor substrate 50. The disposed positions of the heat transfer member 91 and the interposed heat transfer members 92 are determined so as to be adjacent to a region where current concentrates or the electronic components 63 that serve as a heat generating element. Heat of the control substrate 60 is transferred to the bracket 70 via the heat transfer member 91. Heat of the capacitor substrate 50 is transferred to the bracket 70 via the interposed heat transfer members 92.

As shown in FIGS. 1 and 6, the inverter 10 includes a plurality of screws S1, S2, and S3 for fixing the power substrate 20, the control substrate 60, and the capacitor substrate 50 to the heat sink 11 and a plurality of insulating collars C. The plurality of screws S1, S2, S3 include a plurality of first screws S1, a plurality of second screws S2, and a plurality of third screws S3.

The plurality of first screws S1 with the plurality of collars C are fastened to the fixing member 12 of the heat sink 11 through the plurality of third insertion holes H3 of the capacitor substrate 50 and the plurality of first insertion hole H1 of the power substrate 20. Thus, the plurality of first screws S1 are fastened to fix the power substrate 20 and the capacitor substrate 50 together. That is, the heat sink 11 is fixed to the power substrate 20. Some of the plurality of first screws S1 are inserted through the third insertion holes H3 of the capacitor substrate 50, the spacer holes 44 of the spacer 40, and the first insertion holes H1 of the power substrate 20. The first screws S1 through which the spacer holes 44 are inserted serve as a fixing screw fixing the spacers 40 to the power substrate 20.

The plurality of second screws S2 are inserted through some of the fourth insertion holes H4 of the control substrate 60 and the second insertion holes H2 of the power substrate 20 and fastened to the fixing member 12 of the heat sink 11. Thus, the plurality of second screws S2 are fastened to fix the control substrate 60 and the power substrate 20 together.

The plurality of third screws S3 are inserted through some of the fourth insertion holes H4 of the control substrate 60 and fastened to the seat portions 28 of the input terminal 25 and the bracket 70.

The following will describe the function of the inverter 10.

When the inverter 10 is driven to drive the three-phase motor, the power elements 24, the electronic components 63, and the conductor patterns 21, 22, 23, and 52 generate heat. Heat generated by the power substrate 20 including the power elements 24 conducts from the power substrate 20 to the heat sink 11.

Heat generated in the capacitor substrate 50 including the capacitors 54 conducts to the power substrate 20 via the input terminals 25, the output terminals 35, and the spacers 40. The heat transferred to the power substrate 20 conducts to the heat sink 11. Heat of the capacitor substrate 50 can conduct to the heat sink 11 via the power substrate 20. Since the spacers 40 in the present embodiment include the body portion 41 and the heat transfer portion 42, heat of the capacitor substrate 50 conducts to the power substrate 20 via the body portions 41 and the heat transfer portions 42 that serve as a heat transfer path.

Figure 7:
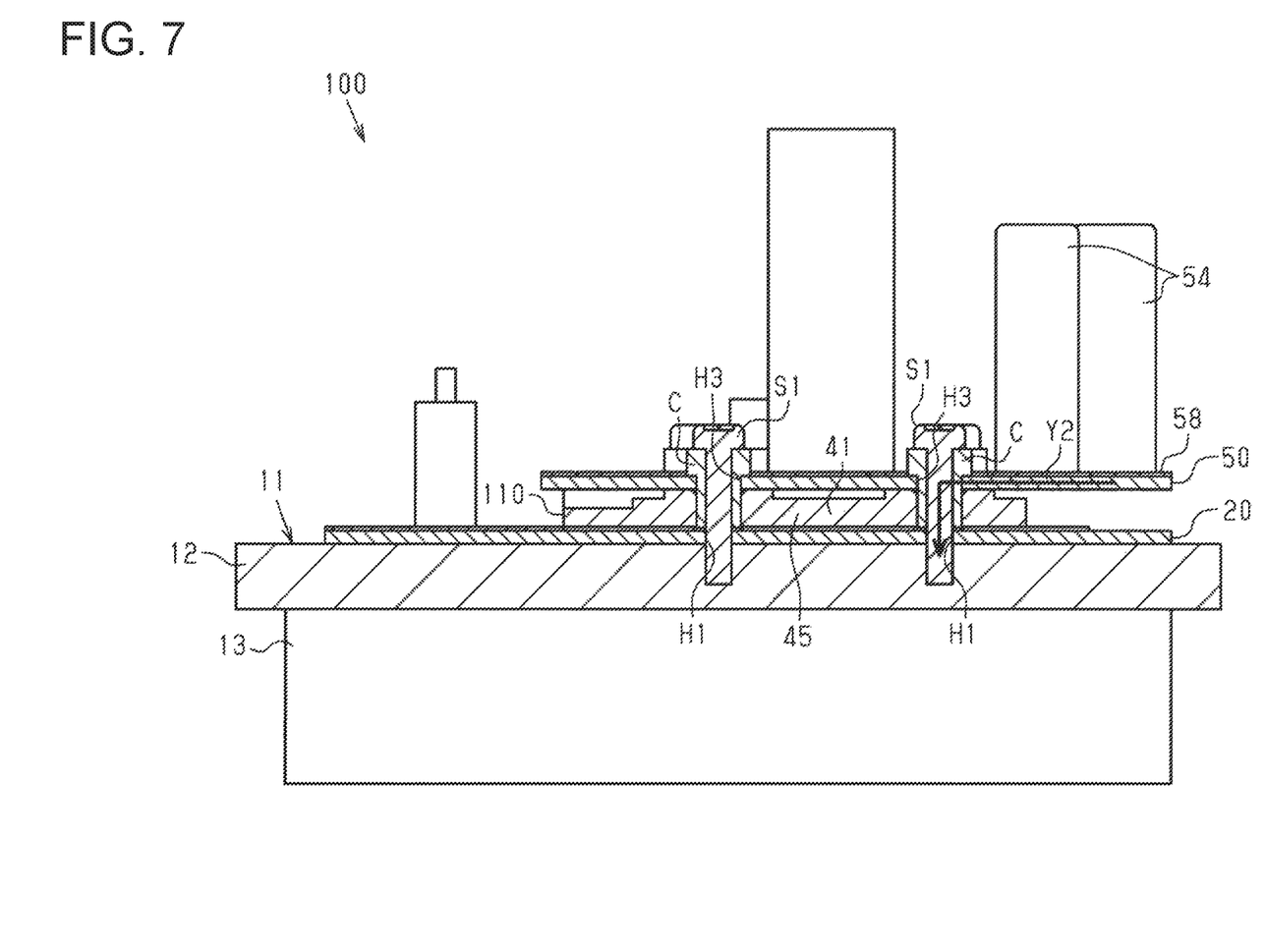
FIG. 7 is a cross-sectional view showing an inverter according to a comparative example.

Referring to FIG. 7, in an inverter 100 according to a comparative example, the shape of a spacer 110 is different from that of the spacer 40 of the inverter 10 according to the present embodiment. The spacer 110 of the inverter 100 according to the comparative example includes the body portion 41 but does not include the heat transfer portion 42. In the case, the heat transfer path of the spacer 40 transferring heat of the capacitor substrate 50 to the power substrate 20 is only the body portion 41. Since the heat transfer path of the spacer 40 is only the body portion 41, the contact area of the spacer 40 with the capacitor substrate 50 and the power substrate 20 is small and the heat capacity of the spacer 110 is also small. As a result, in the inverter 100 according to the comparative example, the amount of heat transferred to the power substrate 20 via the spacer 110 is smaller than that of the inverter 10 according to the present embodiment.

The spacer 40 also serves as a current flowing path for electrically connecting the capacitors 54 and the power elements 24. As indicated by the arrow Y1 in FIG. 6, in the inverter 10 according to the present embodiment, the heat transfer portions 42 serve as a current flowing path in addition to the body portions 41. The heat transfer portions 42 are disposed closer to the capacitors 54 than the body portions 41 in the first direction. Thus, the current flowing path from the capacitors 54 to the power elements 24 in the inverter 10 according to the present embodiment is shorter than that in the inverter 100 according to the comparative example, wherein only the body portions 41 serve as the current flowing path without the heat transfer portions 42 as indicated by the arrow Y2 in FIG. 7.

In the inverter 10 according to the present embodiment, the capacitors 54 are disposed collectively on the side of the one end portion 58 of the capacitor substrate 50. When the capacitors 54 are disposed as described above, a load concentrates on the side of the one end portion 58 of the capacitor substrate 50 due to the weight of the capacitors 54, so that the position of the center of gravity becomes closer to the side of the one end portion 58 than the center C1 of the capacitor substrate 50. Thus, the one end portion 58 of the capacitor substrate 50 tends to bend due to vibration or shock, so that the capacitors 54 tend to fall off. In order to prevent the capacitors 54 from falling off, a potting resin may be provided at the bases of the capacitors 54 to fix the capacitors 54 to the capacitor substrate 50. However, in the case, providing the potting resin is troublesome and the cost of the potting resin is added to the production cost of the inverter 10.

As in the present embodiment, when the heat transfer portions 42 are disposed between the power substrate 20 and the one end portion 58 of the capacitor substrate 50, the capacitor substrate 50 can be supported by the heat transfer portions 42, so that the deflection of the capacitor substrate 50 can be suppressed.

The inverter 10 according to the above embodiment has the following advantageous effects.

(1) Each spacer 40 includes the body portion 41 and the heat transfer portion 42. The heat transfer portion 42 is located outside the power element groups G1 to G6 in the first direction and is disposed at a position not overlapping with the capacitors 54 as viewed in the plate thickness direction of the capacitor substrate 50. Since the heat transfer portion 42 can serve as a heat transfer path in addition to the body portion 41, heat of the capacitor substrate 50 easily transferred to the power substrate 20. Specifically, the heat transfer portion 42 is provided outside the power element groups G1 to G6 in the first direction and at a position not overlapping with the capacitors 54 as viewed in the plate thickness direction of the capacitor substrate 50. For the reason, the heat transfer path in the inverter 10 according to the present embodiment can be widened as compared to the inverter 100 according to the comparative example, in which the spacer 40 includes only the body portion 41. Such a configuration of the inverter 10 can suppress insufficient cooling and performance deterioration of the capacitors 54.

(2) The heat transfer portion 42 of the spacer 40 is disposed between the power substrate 20 and the one end portion 58 of the capacitor substrate 50, so that deflection of the capacitor substrate 50 is suppressed to prevent the capacitors 54 from falling off. Thus, the capacitors 54 do not need to be fixed to the capacitor substrate 50 with a potting resin to prevent the capacitor 54 from falling off.

(3) The spacer 40 is fixed by the first screws S1. The fastening force of the first screws S1 bring the spacer 40 into close contact with the power substrate 20 and the capacitor substrate 50. As a result, the contact resistance can decrease.

(4) The heat transfer portion 42 serves as a current flowing path as well as a heat transfer path. Since the heat transfer portion 42 is provided, the current flowing path from the capacitors 54 to the power elements 24 is shortened, so that the inductance can decrease.

(5) The spacers 40 are disposed closer to the center of the power substrate than the input terminals 25 in the second direction. Since heat easily stays at the center position of the power substrate 20 in the second direction, the spacers are disposed close to the center of the power substrate 20 in the second direction, so that heat dissipation at a position where heat easily stays can increase.

The embodiment may be modified as follows.

The spacers 40 may be fixed by a fixing means other than the first screws S1. For example, the spacers 40 may be fixed to the power substrate 20 and the capacitor substrate 50 with a bonding agent such as solder.

The capacitors 54 may not be disposed collectively closer to the one end portion 58 than the center C1. That is, the capacitors 54 may be disposed on opposite sides of the center C1 of the capacitor substrate 50. In the case, the number of the capacitors 54 disposed on one side of the center C1 and the number of the capacitors 54 disposed on the other side of the center C1 may be the same or different. When the number of the capacitors 54 disposed on one side of the center C1 is different from the number of the capacitors 54 disposed on the other side of the center C1, the heat transfer portion 42 may be provided in a direction in which the position of the center of gravity is biased in the first direction. That is, the heat transfer portion 42 may be provided at a position where the capacitor substrate 50 easily bents.

The heat transfer portion 42 of the spacer 40 may be provided at opposite ends of the body portion 41 in the longitudinal direction of the body portion 41. In the case, each of the heat transfer portions 42 is disposed outside the power element groups G1 to G6 in the first direction.

The bracket 70 may have any shape as long as the bracket can fix the control substrate 60 to the heat sink 11. The bracket 70 may be made of an insulating material such as resin.

The heat transfer member 91 and the interposed heat transfer member 92 may not be provided. A heat release member may be a heat radiation plate not having the fins 13. The heat release member may be cooled by gas refrigerant or liquid refrigerant.

Each of the substrates 20, 50, and 60 may be any substrate such as an insulating metal substrate or may be a printed circuit board. The inverter 10 may not be for an industrial vehicle.

An insulating heat transfer part may be sandwiched between the capacitor substrate 50 and the heat sink 11 (or the power substrate 20) and on the side of the one end portion 58 of the capacitor substrate 50. In the case, the heat transfer part is provided at a position not overlapping with the heat transfer portion 42 as viewed in the plate thickness direction of the capacitor substrate 50. Thus, heat of the capacitor substrate 50 conducts to the heat sink 11 (or the power substrate 20) by using the heat transfer part as a heat transfer path in addition to the heat conduction by the body portion 41 and the heat transfer portion 42. Since the heat transfer part can serve as a cushioning material, the deflection of the capacitor substrate 50 can be further suppressed.

What is claimed is:

1. An inverter comprising:
   a power substrate mounting a plurality of power element groups arranged apart from each other, each of the plurality of power element groups constituted by a plurality of power elements arranged;
   a control substrate disposed apart from the power substrate in a plate thickness direction of the power substrate and mounting an electronic component for controlling the plurality of power elements;
   a capacitor substrate disposed between the power substrate and the control substrate and mounting a plurality of capacitors;
   a heat release member fixed to the power substrate; and
   a spacer electrically connecting the power substrate and the capacitor substrate,
   wherein the spacer includes a body portion disposed between two adjacent power element groups of the plurality of power element groups and a heat transfer portion disposed outside the plurality of power element groups in a direction in which the plurality of power elements are arranged and disposed at a position not overlapping with the plurality of capacitors as viewed in a plate thickness direction of the capacitor substrate.

2. The inverter according to claim 1, wherein the plurality of capacitors are disposed collectively closer to an end portion of the capacitor substrate than a center of the capacitor substrate in the direction in which the plurality of power elements are arranged, and wherein the heat transfer portion is disposed between the end portion of the capacitor substrate and the power substrate.

3. The inverter according to claim 1, wherein the inverter includes a fixing screw fixing the spacer to the power substrate.

* * * * *